United States Patent [19]

West et al.

[11] Patent Number: 5,759,742
[45] Date of Patent: Jun. 2, 1998

[54] PHOTOSENSITIVE ELEMENT HAVING INTEGRAL THERMALLY BLEACHABLE MASK AND METHOD OF USE

[75] Inventors: Paul Richard West, Ft. Collins; Jeffery Allen Gurney, Greeley, both of Colo.

[73] Assignee: Eastman Kodak Company, Rochester, N.Y.

[21] Appl. No.: 719,607

[22] Filed: Sep. 25, 1996

[51] Int. Cl.$^6$ ............... G03F 7/095; G03F 7/30; G03F 7/34; G03F 7/38

[52] U.S. Cl. ........... 430/278.1; 430/944; 430/273.1; 430/259; 430/162; 430/166; 430/155; 430/264; 430/256; 430/302; 430/5

[58] Field of Search .............. 430/944, 273.1, 430/259, 162, 166, 155, 264, 256, 278.1, 302

[56] References Cited

U.S. PATENT DOCUMENTS

| | | |
|---|---|---|
| 4,225,659 | 9/1980 | Drexler ........................ 430/5 |
| 4,515,877 | 5/1985 | Barzynski et al. ........... 430/5 |
| 4,555,471 | 11/1985 | Barzynski et al. ........... 430/273 |
| 4,731,317 | 3/1988 | Fromson et al. ............. 430/155 X |
| 4,777,111 | 10/1988 | Blumel et al. ................ 430/156 |
| 5,262,275 | 11/1993 | Fan ................................ 430/273.1 |
| 5,399,459 | 3/1995 | Simpson et al. ............. 430/270 |

*Primary Examiner*—Cynthia Hamilton
*Attorney, Agent, or Firm*—J. Lanny Tucker

[57] ABSTRACT

A masking element is prepared with a photosensitive layer on a suitable support, overcoated with a masking layer containing an infrared absorbing compound and a thermally bleachable dye. The dye is bleached by imagewise laser irradiation, followed by floodwise exposure to produce an image in the photosensitive layer corresponding to the laser produced image. The outermost layers are removed and development provides a suitable negative-working printing plate.

18 Claims, No Drawings

PHOTOSENSITIVE ELEMENT HAVING INTEGRAL THERMALLY BLEACHABLE MASK AND METHOD OF USE

FIELD OF THE INVENTION

This invention relates to a photosensitive element that is useful as a thermally bleachable masking element. In particular, this invention relates to an element that has an integral masking layer.

BACKGROUND OF THE INVENTION

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image areas retain the water and repel the ink while the image areas accept the ink and repel the water. The ink on the image areas is then transferred to the surface of a material upon which the image is to be reproduced, such as paper, cloth or other materials. Commonly, the ink is transferred to an intermediate material called the blanket which in turn transfers the ink to the surface of the material upon which the image is to be reproduced.

A widely used type of lithographic printing plate has a light-sensitive coating applied to an aluminum base support. The coating may respond to light by having the portion that is exposed become soluble, that is, it is removed in the developing process. Such a plate is referred to in the art as a positive-working printing plate. Conversely, when that portion of the coating that is exposed becomes hardened, the plate is referred to as a negative-working plate. In both instances, the image areas remaining are ink-receptive or oleophilic and the non-image areas or background are water-receptive or hydrophilic. The differentiation between image and non-image areas is made in the exposure process where a film is applied to the plate under vacuum to insure good contact. The plate is then exposed to a light source, a portion of which is composed of UV radiation.

Direct digital imaging of offset printing plates is a technology that has assumed importance to the printing industry. The first commercially successful workings of such technology made use of visible light-emitting lasers, specifically argon-ion and frequency double Nd:YAG lasers. Printing plates with high photosensitivities are required to achieve acceptable through-put levels using plate-setters equipped with practical visible-light laser sources. Inferior shelf-life, loss in resolution and the inconvenience of handling materials under dim lighting are trade-offs that generally accompany imaging systems exhibiting sufficiently high photosensitivities.

Advances in solid-state laser technology have made high-powered diode lasers attractive light sources for plate-setters. Currently, at least two printing plate technologies have been introduced that can be imaged with laser diodes emitting in the infrared regions, specifically at about 830 nm. One of these is described in EP-A-0 573 091 (Agfa) and in several patents and published applications assigned to Presstek, Inc. [for example, U.S. Pat. No. 5,353,705 (Lewis et al), U.S. Pat. No. 5,351,617 (Williams et al), U.S. Pat. No. 5,379,698 (Nowak et al) U.S. Pat. No. 5,385,092 (Lewis et al) and U.S. Pat. No. 5,339,737 (Lewis et al)]. This technology relies upon ablation to physically remove the imaging layer from the printing plate. Ablation requires high laser fluences, resulting in lower through-puts and problems with debris after imaging.

Multilayer printing plates having a top layer that is converted into an integral conformal mask for the underlying layer(s) are known. For example, the CTX printing plate available from Polychrome, and the FNH printing plate available from Fuji Photo each have a silver emulsion layer over conventional printing plate photosensitive layer(s) in order to enable direct digital imaging with low-powered visible-light emitting lasers. The silver pattern remaining after development serves as a mask during flood exposure of the underlying photosensitive layer(s).

A multilayer image-recording material for producing relief images with infrared radiation of wavelengths greater than 1 micrometer is described in U.S. Pat. No. 4,555,471 (Barzynski et al). This material comprises a support bearing a near-UV photosensitive relief-forming layer, a transparent intermediate layer, and a masking layer that undergoes a change in density (either an increase or decrease) when imaged with an infrared laser emitting at wavelengths greater than 1 micrometer. Such a material is processed by imagewise irradiation with an infrared laser, followed by flood-exposure with near-UV radiation. The masking and intermediate layers are then removed, and the relief-forming layer is developed in a conventional fashion. The masking layer was a film that is simply placed on top of or else laminated to the relief-forming layer either before or after the infrared imaging, and is then peeled away before subjecting the relief-forming layer to solution development.

Having the mask-forming layer be a separate film introduces problems due to dirt entrapment, diminishes resolution and makes difficult maintaining a precise relationship between the mask-forming layer and the underlying photosensitive layer(s). The examples in the Barzynski et al patent (noted above) also indicate that high energy is needed for using the disclosed elements.

It would be desirable to have a means for providing masking without the problems attendant with the prior art materials using separate or laminated films, for example additional processing steps, entrapped dirt, high imaging energies, and handling of silver wastes.

SUMMARY OF THE INVENTION

The problems noted above are overcome with a photosensitive element comprising a support and having integrally coated thereon, in sequence:

a) a photosensitive layer, and b) a masking layer comprising a polymeric binder having dispersed therein an infrared absorbing compound and a thermally bleachable dye.

This invention also provides a method of using this element, namely a method of providing an image comprising:

A) imagewise exposing the photosensitive element described above to infrared radiation at a wavelength effective to bleach the thermally bleachable dye and to form an image mask in the masking layer, B) uniformly exposing the element to actinic radiation at a wavelength that is effectively masked by the unbleached thermally bleachable dye, to form an image in the photosensitive layer, C) removing the masking layer, and D) developing the image in the photosensitive layer.

The present invention provides an integral masking element whereby separate or laminated masking films are avoided. The element is easily and readily processed using the process of this invention. Peel development can be used in place of solution processing if desired. Separation of the infrared imaging and processing functions of the various layers allows for greater flexibility in developing printing plates with optimum characteristics since the thermally imageable layer can be coated onto any conventional printing plate. Thermal bleaching can be carried out using modest power levels with compact diode lasers, in contrast to the high energy levels required with prior art materials.

DETAILED DESCRIPTION OF THE INVENTION

The element of this invention comprises a photosensitive layer on a suitable support (described below). A wide variety of radiation-sensitive materials suitable for forming images in the lithographic printing process are known, and are useful in this invention. Any radiation-sensitive formulation that can be formed into a layer on the support, and can be suitably exposed, developed and/or fixed to provide an image is useful. They can be negative-working or positive-working.

Useful negative-working compositions include, but are not limited to, those containing diazo resins, photocrosslinkable polymers and photopolymerizable materials. Useful positive-working compositions include, but are not limited to, aromatic diazooxide compounds such as benzoquinone diazides and naphthoquinone diazides and other photosolubilizing compounds.

Radiation-sensitive materials useful in lithographic printing plates can include silver halide emulsions, quinone diazides (polymeric and non-polymeric) as described in U.S. Pat. No. 4,141,733 (Guild), and references noted therein, light sensitive polycarbonates as described in U.S. Pat. No. 3,511,611 (Rauner et al) and references noted therein, diazonium salts, diazo resins, cinnamal-malonic acids and functional equivalents thereof and others described in U.S. Pat. No. 3,342,601 (Houle et al) and references noted therein, and light sensitive polyesters, polycarbonates and polysulfonates as described in U.S. Pat. No. 4,139,390 (Rauner et al) and references noted therein.

One useful class of negative-working compositions include diazo resins with one or more suitable polymeric binders.

A class of negative-working radiation-sensitive formulations include one or more photocrosslinkable polymers, or photopolymerizable monomers, or a mixture thereof. The photocrosslinkable polymers generally include a photosensitive group, such as a —CH=CH—CO— group within the molecule (typically as an integral part of the backbone), especially the p-phenylene diacrylate polyesters and other photocrosslinkable polyesters described in U.S. Pat. No. 5,122,243 (Hall).

Other photosensitive formulations can include photosensitive polyimides and polyamic acid derivatives such as those described, for example, U.S. Pat. No. 3,957,512 (Kleeberg et al), U.S. Pat. No. 4,416,973 (Goff), U.S. Pat. No. 4,803,147 (Mueller et al), U.S. Pat. No. 5,198,325 (Hupfer et al), EP-A-0 438 382 (Ciba-Geigy), EP-A-0 456 463 (Amoco) and EP-A-0 456 469 (Chisso). Two or more of such resins can be used, if desired.

Other useful photosensitive formulations include a suitable addition polymerizable ethylenically unsaturated compound and a photopolymerization initiator system that includes a spectral sensitizer and a polycarboxylic acid, as described for example in EP-A-0 290 133 (3M).

Photosensitive formulations suitable for peel development include those described in EP-A-0 653 686 (Agfa), EP-A-0 653 685 (Agfa), EP-A-0 653 682 (Agfa), U.S. Pat. No. 5,409,799 (Agfa), EP-A-0 658 744 (Hoechst), EP-A-0 530 674 (Canon) and EP-A-0 568 744 (Hoechst). A particularly useful photosensitive layer of this type can include a polymeric binder, and one or more addition polymerizable ethylenically unsaturated compounds, at least one of which possesses phosphorus-derived acidic functionality (such as a phosphoric, phosphonic or phosphinic group), and a photopolymerization initiator, as described, for example, in copending and commonly assigned U.S. Ser. No. 08/613,931 filed Mar. 11, 1996, by West et al.

The formulation can also include one or more ethylenically unsaturated photopolymerizable monomers. Particularly useful monomers are photosensitive acrylates including mono- and polyfunctional acrylates (including methacrylates). The polyfunctional acrylates are most preferred and include, but are not limited to, such compounds as trimethylol propane trimethacrylate, trimethylol propane acrylate, trimethylol propane ethoxylate triacrylate, trimethylol propane polyethoxylate trimethacrylate, trimethylol propane polyethoxylated triacrylate, pentaerythritol triacrylate, polyethylene glycol diacrylate, triethylene glycol diacrylate, polyethylene glycol dimethacrylate, trimethylene glycol dimethacrylate, and mixtures thereof. Most preferred is pentaerythritol triacrylate. These compounds are available from a number of commercial sources.

The radiation-sensitive formulations useful herein can include conventional sensitizers, photoinitiators, activators, colorants, surfactants (such as siloxane resins and fluorinated esters), polymeric binders, stabilizers, exposure indicators, and other ingredients commonly included therein, as would be readily apparent to one skilled in the art.

The amount of photopolymerizable or photocrosslinkable materials, initiators, and other components in the photosensitive layer would be readily apparent to one skilled in the art since conventional amounts can be used.

The element also includes a masking layer that includes one or more polymeric binders, and dispersed therein, one or more infrared absorbing compounds and one or more thermally bleachable dyes.

Useful polymeric binders include, but are not limited to, cellulosic resins (such as hydroxypropylcellulose, cellulose nitrate, cellulose acetate hydrogen phthalate, cellulose acetate, cellulose acetate propionate, cellulose acetate butyrate, cellulose triacetate, and others known in the art), polycarbonates, polyurethanes, polyesters, poly(vinyl acetate), polystyrene and polystyrene derivatives, vinylpyrrolidone polymers, polyethyloxazoline, and mixtures thereof. The cellulose resins are preferred.

Useful infrared absorbing compounds typically have a maximum absorption wavelength ($\lambda_{max}$) in some part of the electromagnetic spectrum greater than about 750 nm, that is in the infrared region and near infrared of the spectrum. More particularly, they must have a maximum absorption wavelength in a part of the region from about 800 to about 1100 nm. Moreover, the infrared absorbing compound must also transmit radiation at a wavelength that can be effectively used to photopolymerize, photocrosslink or photolyze (or photosolubilizing) the materials in the underlying photosensitive layer (that is, the photosensitive layer must be "photosensitive" at this wavelength). Choosing suitable materials would be routine for a skilled worker in the art. Normally, the useful compounds would not absorb over the entire region so that suitable transmittance could be achieved for the underlying photosensitive layer.

The infrared absorbing compounds can be dyes or pigments, and a wide range of compounds are well known in the art. Classes of materials that are useful include, but are not limited to, squarylium, croconate, cyanine (including phthalocyanine), merocyanine, chalcogenopyryloarylidene, bis(chalcogenopyrylo)polymethine, oxyindolizine, quinoid, indolizine, pyrylium and metal dithiolene dyes or pigments. Other useful classes include thiazine, azulenium and xanthene dyes. Particularly useful infrared absorbing dyes are of the cyanine class.

The amount of infrared absorbing compound in the dried masking layer is generally sufficient to provide an optical density of at least 0.5 in the layer. Preferably, an optical density of from about 1 to about 3. This range would accommodate a wide variety of compounds having vastly different extinction coefficients. Generally, this is at least 1 weight percent, and preferably from 5 to 25 weight percent.

The masking layer also includes a suitable thermally bleachable dye. By "thermally bleachable" is meant compounds that undergo an irreversible chromogenic change from color to colorless when heated by the absorbed laser energy. Also, such dyes generally absorb energy over a range of wavelengths at which the photosensitive formulation is sensitive. The infrared absorbing compound can be selected so as to be substantially transparent over some portion of this range of wavelengths, so exposure of the underlying photosensitive layer is effectively blocked in the masking layer by the unbleached thermally bleachable dye (that is, the dye in the non-imaged areas).

Examples of useful thermally bleachable dyes are described for example in U.S. Pat. No. 5,399,459 (Simpson et al) and references noted therein. Particularly useful thermally bleachable dyes include cyanine or N-alkoxycarbocyanine dyes. The dyes can be used singly or in combination. Pentamethine streptocyanine dyes are most preferred.

The amount of thermally bleachable dye in the dried masking layer is generally at least about 5 weight percent, and preferably from about 10 to about 50 weight percent.

The photosensitive and masking layer formulations are coated out of one or more suitable organic solvents that have no effect on the sensitivity or other properties of the formulations. Various solvents for this purpose are well known, but acetone, methanol, toluene, 2-butanone and 1-methoxy-2-propanol are preferred. The components of the formulations are dissolved in the solvents in suitable proportions.

Optionally, the element also includes a transparent barrier layer between the photosensitive and masking layers. Such barrier layers typically include one or more hydrophilic transparent binder materials, and one or more surfactants (generally nonionic or anionic materials). Such materials are generally coated out of water or water-miscible solvents, such as lower alcohols, or mixtures thereof.

Suitable conditions for drying the various formulations for providing the necessary layers involve heating for a period of time of from about 0.5 to about 5 minutes at a temperature in the range of from about 20 to about 150° C.

To form a photosensitive element of this invention, the formulations are applied (usually by coating techniques) onto a suitable support, such as a metal sheet, polymeric film, ceramics or polymeric-coated paper using conventional procedures and equipment. Suitable metals include aluminum, zinc or steel, but preferably, the metal is aluminum. A most preferred support is an electrochemically grained and sulfuric acid anodized aluminum sheet that has been further treated with an acrylamide-vinylphosphonic acid copolymer according to the teaching in U.S. Pat. No. 5,368,974 (Walls et al). Such elements are generally known as lithographic printing plates, but other useful elements include printed circuit boards.

The thickness of the resulting photosensitive layer on the support, after drying, can vary widely, but typically it is in the range of from about 0.5 to about 2 µm, and preferably from about 1 to about 1.5 µm. The typical dry coverage of this layer is from about 0.5 to about 3 $g/m^2$. For the optional barrier layer, the dry coverage is generally from about 0.1 to about 2 $g/m^2$, and for the masking layer, the dry coverage is generally from about 0.5 to about 3 $g/m^2$.

No other essential layers are provided on the element. In particular, there are no protective or other type of layers over the photosensitive imaging layer. Optional, but not preferred subbing or antihalation layers can be disposed under the photosensitive layer, or on the backside of the support (such as when the support is a transparent polymeric film).

The elements described herein are uniquely adapted for "direct-to-plate" imaging applications. Such systems utilize digitized image formation, as stored on a computer disk, compact disk, computer tape or other digital information storage media, or information that can be provided directly from a scanner, that is intended to be printed. The bits of information in a digitized record correspond to the image elements or pixels of the image to be printed. This pixel record is used to control the exposure device, that is a modulated laser beam. The position of the laser beam can be controlled using any suitable means known in the art, and turned on and off in correspondence with pixels to be printed. The exposing beam is focused onto the unexposed photosensitive element of this invention. Thus, no exposed and processed films are needed for imaging of the elements, as in the conventional lithographic imaging processes.

Laser imaging can be carried out using any moderate or high-intensity laser diode writing device. Specifically, a laser printing apparatus is provided that includes a mechanism for scanning the write beam across the element to generate an image without ablation. The intensity of the write beam generated at the laser diode source at the element is at least about 10 milliwatts/$cm^2$. During operation, the element to be exposed is placed in the retaining mechanism of the writing device and the write beam is scanned across the element to generate an image.

The masking layer is thusly irradiated in an imagewise fashion using a laser, thereby causing thermal bleaching of the thermally bleachable dye in an imagewise pattern at a specific wavelength at which the bleachable dye is sensitive, but the photosensitive layer is not.

Following laser imaging, the element is subjected to floodwise (or complete) exposure to a suitable light source at a wavelength (or a range of wavelengths) that is effectively blocked by the unbleached thermally bleachable dye, and that to which the photosensitive layer is sensitive. This forms an image from the masking layer to the underlying photosensitive layer. Irradiation can be achieved using any suitable source of radiation of the appropriate wavelength. The level of exposure is usually at least 0.1 millijoules/$cm^2$.

Lastly, the masking layer (and optional barrier layer) of the element is washed off with water, and the element is then developed in a conventional alkaline developer solution until the non-image areas are removed to provide the desired negative image in the remaining photosensitive layer. Development can be carried out under conventional conditions for from about 30 to about 120 seconds. One useful aqueous alkaline developer solution is a silicate solution containing an alkali metal silicate or metasilicate. Such a developer solution can be obtained from Eastman Kodak Company as KODAK PRODUCTION SERIES HAND DEVELOPER MX-1589.

Development can also be achieved using "peel development" techniques, as are known in the art. * 13

After development, the element is usually treated with a finisher such as gum arabic.

The following example is provided to illustrate the practice of this invention, and not to limit it in any manner. Unless otherwise noted, all percentages are by weight.

EXAMPLE

A photosensitive coating formulation was prepared as follows:

| COMPONENT | PARTS |
| --- | --- |
| Ternary vinyl acetal copolymer | 1.807 |
| Pentaerythritol triacrylate | 1.333 |
| Copper phthalocyanine pigment dispersion in methoxypropanol (18.7%) | 3.328 |
| SR 9008[1] | 0.666 |
| Kayamer PM-2[2] | 0.222 |
| 3,3'-Carbonylbis(7-diethylamino-coumarin) | 0.044 |
| Anilinediacetic acid | 0.307 |
| BYK-307[3] | 0.011 |
| 2-Butanone | 14.428 |
| Toluene | 23.746 |
| 1-Methoxy-2-propanol | 54.286 |

[1]SR 9008 is an alkoxylated triacrylate (SARTOMER CORP.)
[2]Kayamer PM-2 is the bis(2-hydroxyethyl methacrylate ester) of phosphoric acid (CHUGAI BOYEKI CORP.)
[3]BYK-307 is a polyether-modified polydimethylsiloxane (BYK-Chemie)

A barrier layer formulation was prepared as follows:

| COMPONENT | PARTS |
| --- | --- |
| Mowiol 4-98[1] | 2.465 |
| ZONYL FSN[2] | 0.065 |
| AEROSOL OT[3] | 0.026 |
| Water | 97.444 |

[1]Mowiol 4-98 is 98% hydrolyzed poly(vinyl alcohol) (Hoechst-Celanese)
[2]ZONYL FSN is a fluorosurfactant (DuPont)
[3]AEROSOL OT is the sodium salt of bis(2-ethylhexyl)sulfosuccinic acid (American Cyanamid)

A masking layer formulation was prepared as follows:

| COMPONENT | PARTS |
| --- | --- |
| Hydroxypropylcellulose | 3.554 |
| Glutaconaldehyde dianil chloride | 0.888 |
| 2-{{2-{2-chloro-3-[(1,3-dihydro-1,1,3-trimethyl-2H-benze[e]-indol-2-ylidene)ethylidene]-1-cyclohexen-1-yl}etheneyl}}-1,1,3-trimethyl-1H-benz[e]indolium, salt wtih 4-methylbenzenesulfonic acid | 0.444 |
| BYK-307[1] | 0.011 |
| Methanol | 47.551 |
| 1-Methoxy-2-propanol | 47.551 |

[1]BYK-307 is a polyether-modified polydimethylsiloxane (BYK-Chemie)

The photosensitive layer, barrier layer and masking layer formulations were applied sequentially with drying between applications onto an aluminum plate that had been electrochemically grained, anodized in sulfuric acid and post-treated with an acrylamide-vinyl phosphonic acid copolymer as described in U.S. Pat. No. 5,368,974 (Walls et al). The three layers' formulations were applied to provide dry coating weights of 1.2 g/m², 1.1 g/m² and 1.2 g/m², respectively.

The resulting printing plate was imaged at a dose of 550 mJ/cm² with a 500 mW diode laser emitting a modulated pulse centered at 830 nm. The plate was then flood exposed with light from a mercury/xenon arc lamp filtered through a 480 nm band pass filter, baked 1 minute at 100° C., rinsed with water and processed with commercially available KODAK Production Series MX 1587-1 machine developer to reveal a high-resolution negative image.

The plate was then mounted on a commercially available A.B. Dick model 9870 duplicator press and was used to produce more than 1000 flawless prints. A section of the plate was cut off before the rinse step in order to evaluate processing by peel development. Application of masking tape and peeling removed the mask layer, intermediate layer and the unexposed portions of the photosensitive layer in a single operation, leaving behind the portions of the photosensitive coating corresponding to the original infrared image.

The invention has been described in detail with particular reference to preferred embodiments thereof, but it will be understood that variations and modifications can be effected within the spirit and scope of the invention.

We claim:

1. A photosensitive element comprising a support and having integrally coated thereon, in sequence:

a) a photosensitive layer, and b) a masking layer comprising a polymeric binder having dispersed therein an infrared absorbing compound and a thermally bleachable dye.

2. The element of claim 1 wherein said support is a metal support.

3. The element of claim 2 wherein said support is a grained and anodized aluminum support.

4. The element of claim 1 wherein said photosensitive layer comprises a photopolymerizable, photocrosslinkable or photosolubilizing compound.

5. The element of claim 4 wherein said photosensitive layer comprises a multifunctional polymerizable acrylate monomer.

6. The element of claim 1 wherein said infrared absorbing compound is a cyanine, squarylium, croconate, chalcogenopyryloarylidene, bis(chalcogenopyrylo)polymethine, indolizine, pyrylium, oxyindolizine, bis(aminoaryl)polymethine, merocyanine, croconium, metal dithiolene or quinoid dye or pigment, or a dark inorganic pigment.

7. The element of claim 6 wherein said infrared absorbing compound transmits radiation at a wavelength to which said photosensitive layer is sensitive.

8. The element of claim 6 wherein said infrared absorbing compound is a cyanine dye.

9. The element of claim 1 wherein said thermally bleachable dye absorbs radiation at a wavelength to which said photosensitive layer is sensitive.

10. The element of claim 9 wherein said thermally bleachable dye is a pentamethine streptocyanine dye.

11. The element of claim 1 further comprising an integrally coated transparent barrier layer between said photosensitive and masking layers, said barrier layer comprising a transparent water-soluble polymer.

12. A lithographic printing plate consisting essentially of a grained and anodized aluminum support and having integrally coated thereon, in sequence:

a) a photosensitive layer comprising a photosensitive polymerizable monomer, said photosensitive layer being present at a dry coverage of from about 0.5 to about 3 g/m².

b) a transparent barrier layer comprising a transparent hydrophilic polymer, said barrier layer being present at a dry coverage of from about 0.1 to about 2 g/m², and c) a masking layer comprising a polymeric binder having dispersed therein an infrared absorbing compound and a thermally bleachable pentamethine streptocyanine dye, said masking layer being present at a coverage of from about 0.5 to about 3 g/m².

13. The element of claim 12 wherein said infrared absorbing compound transmits radiation at a wavelength, and said pentamethine streptocyanine dye absorbs radiation at said same wavelength, said wavelength being sufficient to cause polymerization of said photosensitive polymerizable monomer.

14. A method of providing an image comprising:

A) imagewise exposing a photosensitive element comprising a support and having integrally coated thereon, in sequence:
   a) a photosensitive layer, and
   b) a masking layer comprising a polymeric binder having dispersed therein an infrared absorbing compound and a thermally bleachable dye, to infrared radiation at a wavelength effective to bleach said thermally bleachable dye and to form an image mask in said masking layer, B) uniformly exposing said element to actinic radiation at a wavelength that is effectively masked by said thermally bleachable dye, to form an image in said photosensitive layer, C) removing said masking layer, and D) developing said image in said photosensitive layer.

15. The method of claim 14 wherein said infrared radiation is provided using a laser at a power less than that required for significant ablation of said masking layer.

16. The method of claim 14 further comprising a step of heating said plate between steps B and C to a temperature of at least about 50° C.

17. The method of claim 14 wherein said development step D is carried out using a developer solution.

18. The method of claim 14 wherein said photosensitive element is a lithographic printing plate consisting essentially of a grained and anodized aluminum support and having integrally coated thereon, in sequence:

a) a photosensitive layer comprising a photosensitive polymerizable monomer, said photosensitive layer being present at a dry coverage of from about 0.5 to about 3 g/m², b) a transparent barrier layer comprising a transparent hydrophilic polymer, said barrier layer being present at a dry coverage of from about 0.1 to about 2 g/m², and c) a masking layer comprising a polymeric binder having dispersed therein an infrared absorbing compound and a thermally bleachable pentamethine streptocyanine dye, said masking layer being present at a coverage of from about 0.5 to about 3 g/m².

* * * * *